US008529309B2

(12) United States Patent
Heeks et al.

(10) Patent No.: US 8,529,309 B2

(45) Date of Patent: Sep. 10, 2013

(54) BACKLIT DISPLAYS INCLUDING ORGANIC LIGHT-EMISSIVE MATERIAL

(75) Inventors: Stephen Karl Heeks, Cambridge (GB); Julian Charles Carter, Cambridge (GB)

(73) Assignee: Cambridge Display Technology Limited, Cambridge (GB)

(*) Notice: Subject to any disclaimer, the term of this patent is extended or adjusted under 35 U.S.C. 154(b) by 0 days.

(21) Appl. No.: 13/526,046

(22) Filed: Jun. 18, 2012

(65) Prior Publication Data

US 2012/0326600 A1 Dec. 27, 2012

Related U.S. Application Data

(60) Division of application No. 12/127,053, filed on May 27, 2008, now abandoned, which is a continuation of application No. 11/434,290, filed on May 15, 2006, now Pat. No. 7,402,091, which is a continuation of application No. 09/719,955, filed as application No. PCT/GB99/01918 on Jun. 16, 1999, now Pat. No. 7,116,308.

(30) Foreign Application Priority Data

Jun. 19, 1998 (GB) .................................. 9813326.7

(51) Int. Cl.
*H05B 33/14* (2006.01)
*H05B 33/10* (2006.01)

(52) U.S. Cl.
USPC ........................................................... 445/24

(58) Field of Classification Search
USPC ............................ 445/24–25; 313/500–512
See application file for complete search history.

(56) References Cited

U.S. PATENT DOCUMENTS

| | | | |
|---|---|---|---|
| 5,504,183 | A | 4/1996 | Shi et al. |
| 5,519,565 | A | 5/1996 | Kalt et al. |
| 5,965,907 | A | 10/1999 | Huange et al. |
| 6,087,196 | A | 7/2000 | Sturm et al. |
| 6,179,400 | B1 | 1/2001 | Akahira et al. |
| 6,485,884 | B2 | 11/2002 | Wolk et al. |
| 6,518,700 | B1 | 2/2003 | Friend et al. |

(Continued)

FOREIGN PATENT DOCUMENTS

| | | |
|---|---|---|
| EP | 0702251 | 3/1996 |
| JP | 09180883 | 7/1997 |

(Continued)

OTHER PUBLICATIONS

Bharathan et al., "Polymer Electroluminescent Devices Processed by Inkjet Printing: I. Polymer Light-Emitting Logo," Applied Physics Letters, vol. 72, No. 21, pp. 2660-2662, May 25, 1998.

(Continued)

*Primary Examiner* — Anh Mai
*Assistant Examiner* — Elmito Breval
(74) *Attorney, Agent, or Firm* — DLA Piper LLP (US)

(57) ABSTRACT

A display device comprising: a light switching unit comprising an array of pixels each operable to vary the transmission of light therethrough; and a backlight comprising a first series of regions of organic light-emissive material having a first emission color and a second series of regions of organic light-emissive material having a second emission color, each region of organic material being located so as to lie behind a plurality of pixels of the array in the viewing direction for backlighting those pixels; and at least one of the regions of organic light-emissive material being formed by a process of ink-jet deposition.

8 Claims, 2 Drawing Sheets

22 60 61 62 63 64 21 50 51 52 53 54 65 36 25 20 49 23R 30 24G 31 25B 32 26R 33 27G 34 70 70 70 70 29 45 46 48 47

(56) References Cited

U.S. PATENT DOCUMENTS

| | | | |
|---|---|---|---|
| 6,566,156 | B1 | 5/2003 | Sturm et al. |
| 6,602,540 | B2 | 8/2003 | Gu et al. |
| 6,982,179 | B2 | 1/2006 | Kwong et al. |
| 2001/0030320 | A1 | 10/2001 | Budd et al. |
| 2003/0030371 | A1 | 2/2003 | Liao et al. |

FOREIGN PATENT DOCUMENTS

| | | |
|---|---|---|
| JP | 09330792 | 12/1997 |
| JP | 10012377 | 1/1998 |
| JP | 10106751 | 4/1998 |
| JP | 10149879 | 6/1998 |
| JP | 10153967 | 6/1998 |
| WO | WO 91/10223 | 7/1991 |
| WO | WO 93/13514 | 7/1993 |
| WO | WO 95/21400 | 8/1995 |
| WO | WO 96/33483 | 10/1996 |
| WO | WO 97/38347 | 10/1997 |
| WO | WO 98/24271 | 6/1998 |

OTHER PUBLICATIONS

English translation of JP office action in corresponding JP aplication 2000-555231, Oct. 14, 2003.

Machine english translation of JP 10-153967 to Miyashita et al.

22
60
61
62
63
64
50
51
52
53
54
21
65
36
20
49
25
23R
30
24G
31
25B
32
26R
33
27G
34
70
29
45
46
47
48

BACKLIT DISPLAYS INCLUDING ORGANIC LIGHT-EMISSIVE MATERIAL

RELATED APPLICATIONS

This application is a division of U.S. Ser. No. 12/127,053, filed May 27, 2008 now abandanoned which is a continuation of U.S. Ser. No. 11/434,290, filed May 15, 2006, which issued as U.S. Pat. No. 7,402,091 on Jul. 22, 2008, which is a continuation of U.S. Ser. No. 09/719,955 filed Mar. 15, 2001, which issued as U.S. Pat. No. 7,116,308 on Oct. 3, 2006, which is a national stage of PCT/GB99/01918 filed Jun. 16, 1999, which claims priority to GB 9813326.7 filed Jun. 19, 1998, the contents of which are all incorporated herein in their entirety.

FIELD OF THE INVENTION

This invention relates to display devices, especially backlit display devices, and backlights for displays. The backlighting is suitably provided by means of organic light-emissive material.

BACKGROUND OF THE INVENTION

Light-emissive organic materials are described in PCT/WO90/13148 and U.S. Pat. No. 4,539,507, the contents of both of which are incorporated herein by reference. The basic structure of these devices is a light-emissive organic layer, for instance a film of a poly(p-phenylenevinylene ("PPV"), sandwiched between two electrodes. One of the electrodes (the cathode) injects negative charge carriers (electrons) and the other electrode (the anode) injects positive charge carriers (holes). The electrons and holes combine in the organic layer generating photons. In PCT/WO90/13148 the organic light-emissive material is a polymer. In U.S. Pat. No. 4,539,507 the organic light-emissive material is of the class known as small molecule materials, such as (8-hydroxyquinolino)aluminium ("Alq3"). In a practical device, one of the electrodes is typically transparent, to allow the photons to escape the device.

FIG. 1 shows the typical cross-sectional structure of an organic light-emissive device ("OLED"). The OLED is typically fabricated on a glass or plastic substrate 1 coated with a transparent first electrode 2 such as indium-tin-oxide ("ITO"). Such coated substrates are commercially available. This ITO-coated substrate is coated with at least a layer of a thin film of an electroluminescent organic material 3 and a final layer forming a second electrode 4 which is typically a metal or alloy. Other layers can be added to the device, for example to improve charge transport between the electrodes and the electroluminescent material.

Organic light-emissive materials have great potential for use in various display applications. One such application is as a backlight for transmissive or transflective liquid crystal displays. In a liquid crystal display there is typically a planar liquid crystal cell which has active regions where the optical properties of the liquid crystal material can be altered by the application of an electric field to vary the transmission of light through the regions. In a transmissive liquid crystal display there is a light source behind the liquid crystal panel; and light from the source shines to a viewer through those of the regions through which light can be transmitted. In a transflective liquid crystal display the light source is supplemented by a reflective mirror, also behind the liquid crystal panel, which can return incident light towards the viewer.

The shape and layout of the active liquid crystal regions is generally defined by the pattern of electrodes in the LCD.

Some patterns are specific to alpha-numeric or special character formats. An alternative is a general dot matrix display pattern, in which the active regions are usually arranged to provide an array of pixels. The pixels are normally arranged in an orthogonal grid layout, with the pixels arranged in mutually perpendicular linear rows and columns, but other layouts such as non-orthogonal grids are possible. The LCD pixels can be controlled by a conventional display controller.

FIG. 2 shows a schematic plan view of the basic structure of a passive-matrix LCD. There are orthogonal row 10 and column 11 lines of a transparent conductor such as ITO. These form the electrodes. The row and column lines are separated in the plane of FIG. 2 by the liquid crystal layer itself. (For simplicity other LCD components such as polarisers, alignment layers, the liquid crystal layer and colour filters are omitted from FIG. 2). The areas where row and column lines overlap define the active regions (pixels) of the device (e.g. at 13), which can be addressed by applying a voltage between the relevant row and column lines. Because the column lines run across the row lines it is not possible to individually address all the pixels at the same time. Instead, the pixels are addressed with a row-by-row scan. An alternative drive arrangement for an LCD is the active-matrix arrangement, in which each pixel has individual control circuitry, which can conveniently be in the form of thin-film transistors (TFTs), to allow more continuous driving of the pixels.

To manufacture a multi-colour display using an LCD panel it is known to provide backlights which are selectively operated to emit coloured light through pixels of the LCD panel. The operation of the backlights and the LCD panel can, if necessary, be synchronised so that the LCD pixels allow light to pass through a pixel only when the appropriate backlight colour is being emitted. For example, WO 91/10223 describes a backlit LCD formed by placing a single LCD panel, which provides a matrix of pixels, over a bank of red, green and blue fluorescent lamps. The aim of this arrangement is to improve efficiency by avoiding the need for colour filters to provide the coloured light. WO 93/13514 describes a colour fluorescent backlight for an LCD in which a backlight is provided by a plurality of phosphorescent strips capable of emitting red, green and blue light located in a vacuum chamber. PCT/GB96/00924 describes the use of a light modulator comprising a passive matrix LCD and an electroluminescent LED. The light source is addressable to emit light from selected regions, each region overlapping at least a plurality of rows of the light modulator, with the aim of reducing crosstalk in the display.

SUMMARY OF THE INVENTION

There is a need for a simplified and less expensive system to provide colour backlighting for LCDs etc., especially one in which the backlighting can be finely distributed, to cope with small LCD pixels, and precisely positioned.

According to one aspect of the present invention there is provided a display device comprising: a light switching unit comprising an array of pixels each operable to vary the transmission of light therethrough; and a backlight comprising a first series of regions of organic light-emissive material having a first emission colour and a second series of regions of organic light-emissive material having a second emission colour, each region of organic material being located so as to lie behind a plurality of pixels of the array in the viewing direction for backlighting those pixels; and at least one of the regions of organic light-emissive material being formed by a process of ink-jet deposition.

According to a second aspect of the present invention there is provided a method for forming a light-emissive unit of a display device, the display device having a light switching unit comprising an array of pixels each operable to vary the transmission of light therethrough, the method comprising the steps of: forming a series of grooves on a substrate; depositing by means of ink jetting in some of the grooves a first organic light-emissive material having a first emission colour; depositing by means of ink-jetting in others of the grooves a second organic light-emissive material having a second emission colour; and locating the grooves such that the light-emissive material in each groove lies behind a respective plurality of pixels of the array in the viewing direction for backlighting those pixels.

Preferably each region of organic light-emissive material is formed by a process of ink jet deposition. This suitably allows for efficient, fine and accurate definition of those regions.

The backlight may comprise a third series of regions of organic light-emissive material having a third emission colour; and may comprise more such regions, giving four or more emission colours. Each region of organic light-emissive material having one emission colour is suitably spaced from the next such region by at least regions of organic light-emissive material having both of the other emission colours. For example, the materials may alternate across the plane of the device. One preferred option is for the materials to be red, green and blue light-emissive. The regions of organic light-emissive material are preferably linear regions, but could be curved, irregularly shaped or have other forms. Adjacent regions preferably run side-by-side, so that where the regions are linear they are preferably parallel. Preferably a single one of the regions of light-emissive material lies behind each pixel.

It is preferred that where one of the regions of light-emissive material is formed by means of ink-jet deposition it is formed by means of ink-jet deposition of material into a groove. That groove (and in particular its walls) may be defined by regions of electrically insulating material.

The backlight preferably comprises electrodes located on either side of the light-emissive material. At least one of the electrodes is preferably light transmissive, and that electrode preferably lies between the emissive material and the pixels. Where the device comprises the said insulating material defining grooves it is preferred that parts of at least one of the electrodes overlap parts of that insulating material and lie in front of those parts of the insulating material in the viewing direction. The said material defining grooves may comprise at least two layers of material, in which case those layers preferably have different wetting properties. One of those layers, where present, preferably defines the lower portions of the walls of the groove and has similar wetting properties to the material that defines the base of the groove (e.g. one of the electrodes).

To improve charge distribution and/or lower resistance in either or both of the electrodes conductive material may be located in contact with the or each electrode. That conductive material preferably comprises a metal or an alloy. Where the device comprises the said insulating material defining grooves it is preferred that the said regions of conductive material at least partially overlap the insulating material. Preferably at least one of the electrodes is patterned, most preferably linearly patterned to leave a series of independent electrode strips, so as to permit independent control of each light-emissive region or each series of light-emissive regions. The said linear regions preferably correspond to rows of a display. In a preferred embodiment only one of the electrodes is patterned to permit independent control of each series of light-emissive regions and the other electrode is common to all the light-emissive regions.

The device may include a structure for spatially narrowing the light emission from at least one of the regions of light-emissive material. That structure may comprise some or all of the light-emissive structure of that region. Some non-limiting possibilities for such a structure are an interference, cavity and/or microcavity structure. Where the structure includes a resonant cavity the cavity may be defined at least in part by the light-emissive material and/or one or more electrodes. A resonant structure may, in addition to or instead of spatially altering the emitted light, spectrally alter it for instance by spectrally redistributing the light to influence the emission colour, e.g. to purify the colour and sharpen the emission spectrum.

The device may comprise an optical colour filter arranged for receiving and filtering light emitted from at least one or of the regions of light-emissive material. All the light-emissive regions of a colour may have corresponding filters.

The light switching unit is suitably a liquid crystal unit. The array of pixels may be an orthogonal array.

The organic light-emissive material is suitably a preferably solution processable, and most preferably ink-jettable. The material is suitably a polymer and preferably a conjugated polymer.

The device may suitably also comprise a display control unit coupled to the light switching unit and the backlight. The display control unit is suitably operable to address synchronously each region of organic material together with the pixels of behind which that region lies. The display control unit is suitably capable of controlling the light switching unit and the backlight in response to video input signals received by the display control unit.

Some preferred materials for components (where present) of the light-emissive unit are as follows:

One of the electrodes or "charge carrier injecting layers" (the hole injecting layer) preferably has a work function of greater than 4.3 eV. That layer may comprise a metallic oxide such as indium-tin oxide ("ITO") or tin oxide ("TO"). The other electrode/charge carrier injecting layer (the electron injecting layer) preferably has a work function less than 3.5 eV. That layer may suitably be made of a metal with a low work function (Ca, Ba, Yb, Sm, Li etc.) or an alloy comprising one or more of such metals together optionally with other metals (e.g. Al). At least one of the electrode layers is suitably light transmissive, and preferably transparent, suitably at the frequency of light emission from one or more of the light-emissive regions.

There may be one or more charge transport layers between the light-emissive material and the charge carrier injecting layers. The or each transport layer may suitably comprise one or more polymers such as polystyrene sulphonic acid doped polyethylene dioxythiophene ("PEDOT-PSS") and/or poly(2,7-(9,9di-n-octylfluorene)-(1,4-phenylene-(4-imino(benzoic acid))-1,4-phenylene-(4-imino(benzoic acid))-1,4-phenylene)) ("BFA") and/or polyaniline and/or PPV.

The or each organic light-emissive material may comprise one or more individual organic materials, suitably polymers, preferably conjugated or partially conjugated polymers. Suitable materials include poly(pphenylenevinylene) ("PPY"), poly(2-methoxy-5(2'-ethyl)hexyloxyphenylenevinylene) ("MEH-PPV"), a PPV-derivative (e.g. a di-alkoxy or di-alkyl derivative), a polyfluorene and/or a co-polymer incorporating polyfluorene segments, PPVs and/or related co-polymers, poly (2,7-(9,9-di-n-octylfluorene)(1,4-phenylene-((4-secbutylphenyl)imino)-1,4-phenylene)) ("TFB"), poly (2,7(9,9-di-n-octylfluorene) (1,4-phenylene-((4-methylphenyl)imino)-1,4-phenylene-((4-methylphenyl) imino)-1,4-phenylene)) ("PFM"), poly(2,7-(9,9-di-n-octylfluorene) ("F8") or (2,7-(9,9-di-n-octylfluorene)-3,6-Benzothiadiazole) ("F8BT"). Alternative materials include organic molecular light-emissive materials, e.g. solution processible small molecule materials such as spiro compounds (see EP 0 676 461 A), and other solution processible small molecule or conjugated polymer electroluminescent material as known in the prior art.

The present invention also provides a combination of a light-emissive unit as described and a light switching unit as described.

It will be appreciated that the term ink-jet deposition refers to a type of deposition process and does not imply that the material to be deposited is an ink.

BRIEF DESCRIPTION OF DRAWINGS

The present invention will now be described by way of example with reference to the accompanying drawings, in which.

DETAILED DESCRIPTION

Figure 1:
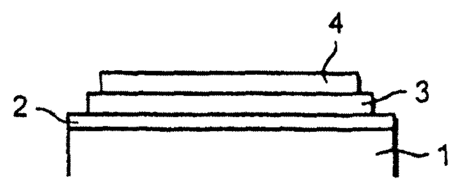
FIG. 1 shows a schematic cross-sectional view of a typical organic light-emissive device ("OLED")
Figure 2:
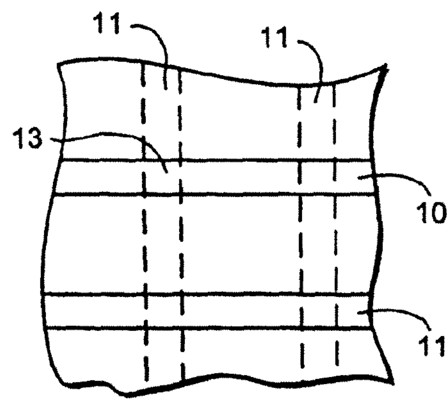
FIG. 2 shows a schematic plan view of the basic structure of a passive-matrix LCD.
Figure 3:
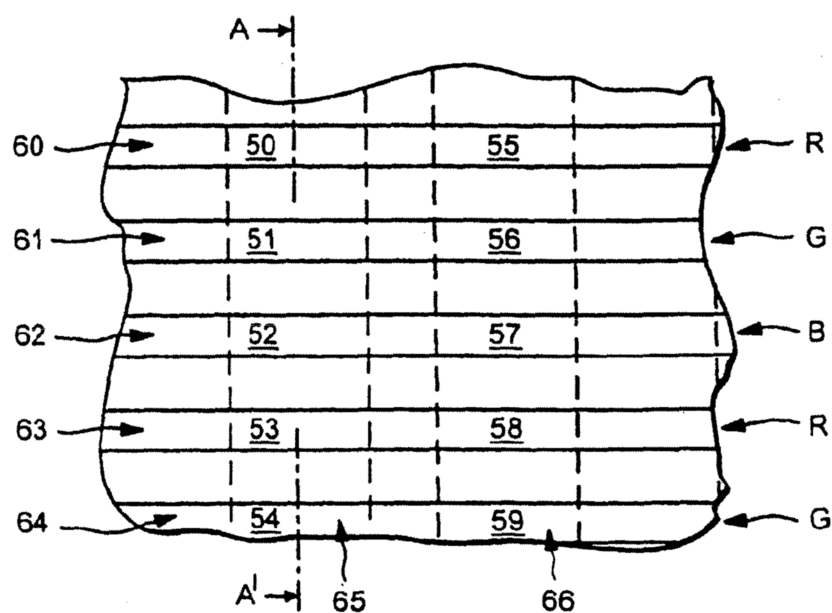
FIG. 3 shows a schematic plan view of part of a display device.
Figure 4:
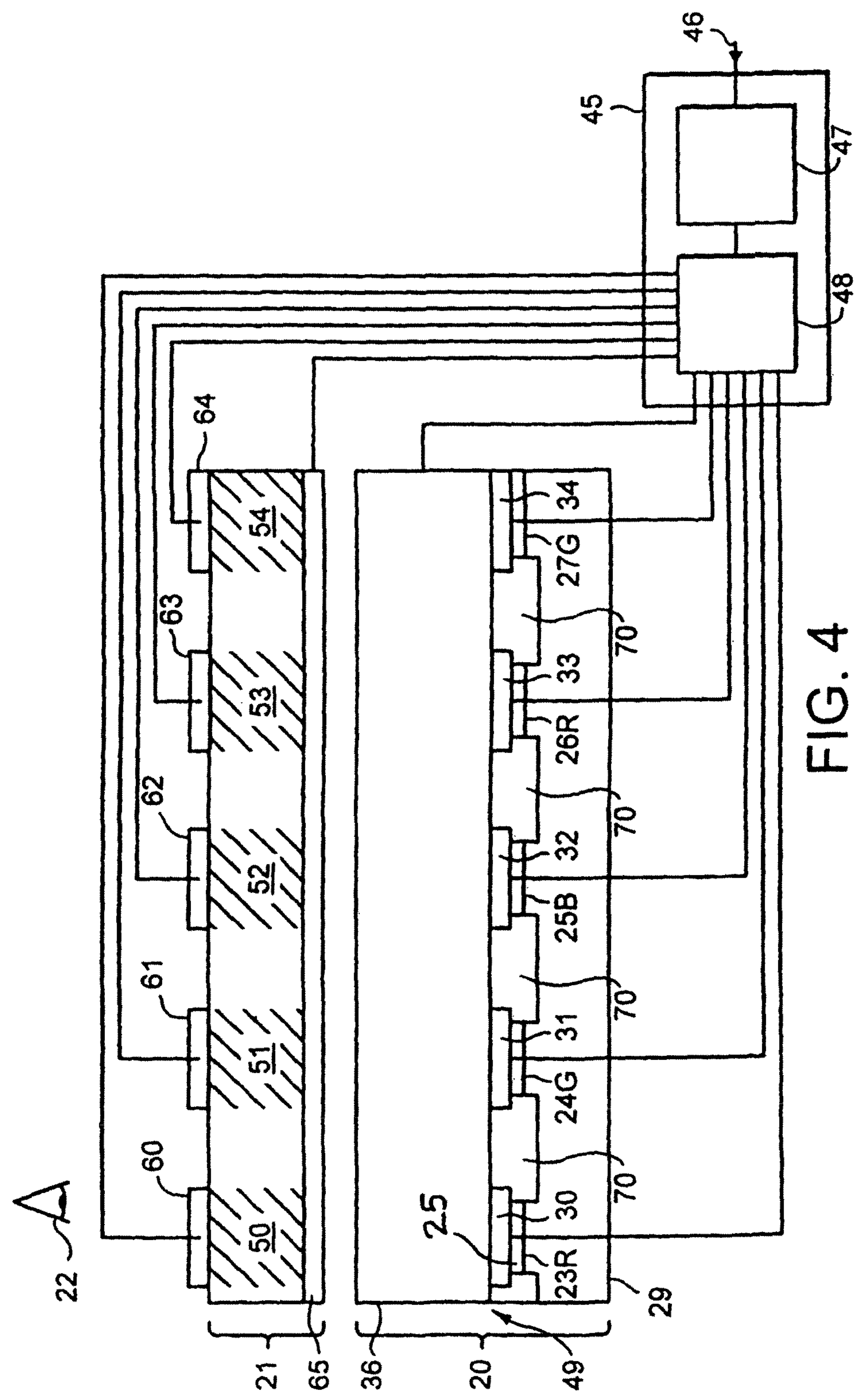
FIG. 4 shows a schematic cross-sectional view of part of the display device on the line A-A' in FIG. 3.

The device of FIGS. 3 and 4 is a three-colour backlit LCD display device. The device comprises a planar backlight unit 20 and a planar LCD unit 21. The backlight unit is located behind the LCD unit 21 in the viewing direction, so that in the emission direction light from the backlight can pass through any light transmissive pixels of the LCD unit and towards a viewer 22 (FIG. 4).

The backlight is provided by an organic light-emissive device which has a plurality of parallel linear regions 23-27 of light-emissive material. Each region is provided by one of three different emissive materials which emit correspondingly different colours of light. The materials alternate so that the regions are in groups of red, green and blue emissive materials, as indicated in FIGS. 3 and 4 by the initials R, G and B. The emissive regions are sandwiched between anode and cathode electrodes. The cathode electrode 29 is common to all the emissive regions. The anode electrode is patterned into distinct rows 30-34 which each overlie a respective one of the emissive regions, so that the emissive regions can be controlled independently. The anode is formed of a light transmissive material. The anode is deposited on a glass substrate 36.

The LCD unit is a normal passive-matrix LCD unit in which the pixels 50-59 are arranged on an orthogonal grid and are connected by row 60-64 and column 65, 66 electrodes.

The backlight is dimensioned and located relative to the LCD unit so that each row of pixels in the LCD unit is underlain by one red, green or blue emissive region of the backlight. In FIGS. 3 and 4 pixels 50 to 54 are underlain by regions 23 to 27 respectively, as are pixels 55 to 59 in FIG. 3 only.

The backlight unit and the LCD unit are connected to a control unit 45. The control unit receives a video data feed at 46, which defines the colour pattern to be shown on the display. The video feed could come from any suitable source, such as (without limitation) a television decoder, a personal computer or another electronic device. The pattern may represent a frame of a multi-frame moving image. In the normal way a separating unit 47 of the control unit separates the colour pattern into red, green and blue pattern components which can be displayed in turn to give a user a time-averaged impression of the desired full colour pattern.

A driver unit 48 of the control unit then drives the pixels of the LCD device and, in synchronisation with the LCD device, the emissive regions of the backlight. First, a suitable voltage and current is applied between the cathode 29 and the anode electrode strip 30 which corresponds to red emissive region 23. This causes that regions to emit red light. At the same time the pixels 50, 55 of the LCD panel are controlled using electrodes 60, 65 and 66 to allow transmission only where red light is to be emitted for the red component of the pattern. After a predetermined duration the driver unit turns off the red emissive region 23. Then a voltage and current to cause the green emissive regions 24 to emit light and at the same time the pixels 51, 56 of the LCD panel are controlled to allow transmission only where green light is to be emitted for the green component of the pattern. After a predetermined duration has passed the driver unit turns off the green emissive region 24 and applies a voltage and current to cause the blue emissive region 25 to emit light at the same time as the pixels 52, 57 of the LCD panel are controlled to allow transmission only where blue light is to be emitted for the blue component of the pattern. The rapid switching between colours gives a viewer an impression of a steady full-colour pattern. The process continues until all the rows of the display have been scanned in this way. After that the display controller causes the display to cycle through the rows again. To display a moving image that next cycle could show the pattern of the next frame.

The device could use more or fewer than three emission colours, driven in a corresponding way to that described above.

The duration of display of each colour could be the same or different. If the emissive regions for different colours differed in efficiency then the duration of display could be related to the efficiency so that the time-averaged intensity of emission of each colour was substantially the same. The frequency of cycling through all three colours could vary; convenient frequencies are in the range from 50 to 120 Hz but higher or lower frequencies could be used.

The LCD device may have several thousand pixels. For instance, one typical size is 800 columns by 600 rows, giving a total of 480,000 pixels. A typical pixel size is 300×100 μm.

The light-emissive regions could run parallel to the rows or, less preferably, the columns of the LCD unit.

The manufacture of the device will now be described.

The backlight unit is manufactured taking as a first step a commercially available ITO-coated glass substrate. The ITO is then patterned in lines by a standard process such as photolithography to define the separate electrode regions 30-34. Additional lines of metallisation could be provided in contact with the ITO, e.g. between the ITO and the glass substrate, or in the plane of the ITO, to help distribute charge in the ITO. Preferably the metallisation lines are at least in part located between the bank and the glass substrate.

Over the ITO an insulating layer shown generally at 49 is deposited and then patterned to leave banks 70 of insulating material that lie between and overlap the edges of the anode strips 30-35.

The banks 70 define grooves in the gaps between adjacent banks. The banks may suitably be formed of polyimide or any other suitable insulating material such as $SiO_2$.

To help the formation of the light-emissive region in the grooves between the banks, especially when the material that is to form the light-emissive region is deposited by ink-jet printing, a differential wetting bank formation may be used. The bank may be formed from two layers of material: one thin layer that is easily wettable by the material that is to form the light-emissive region, and over that a thicker layer that defines the upper walls of the groove and is not easily wettable by the material that is to form the light-emissive region. Then when the material that is to form the light-emissive region is deposited in the region it tends to bead up at the base of the groove.

The banks overlap the edges of the ITO anode strips. This helps to define sharp edges to the light emission from the light-emissive regions.

Then the light-emissive material is deposited by ink-jet printing into the grooves that are defined between the banks. To deposit the light-emitting material by inkjet printing the material or a precursor of the material is sprayed into the appropriate groove through an ink jet printer spray head. A suitable spraying cycle is 14,400 drops per second, with a drop volume of 30 pl. The ink jet system could be a continuous stream system (e.g. using electrostatic directional control of the stream) or a drop-on-demand system using e.g. a piezoelectric or bubble-jet print head. Some examples of suitable light-emissive materials are: for the red emissive regions a di-alkoxy PPV, for the green emissive regions PPV (e.g. prepared by the precursor route) and for the blue emissive regions a polyfluorene. Other materials and other colours could, of course, be used. An alternative to using the grooves is to use a differential wetting process: the substrate on to which the emissive material is to be deposited could be treated with a wetting agent or a non-wetting agent to cause the ink jetted material to bead up into the desired formations over the anode strips.

Instead of ink-jet printing other selective deposition methods could be used, preferably methods that allow for easy patterning of the light-emissive regions into stripes. Other selective deposition methods that may be suitable include screen printing (which is especially appropriate for large-area displays), masking techniques, off-set printing, screen printing, electrostatic printing, gravure printing and flexographic printing.

Finally the cathode layer 29 is deposited over the banks and the emissive layers. PPV. The cathode layer could be a thin layer of calcium adjacent to the emissive regions, topped by a thicker layer of aluminium.

One or more charge carrier transport layers, for instance of PEDOT-PSS or other materials could be located between the anode strips and the light-emissive regions and/or between the cathode and the light-emissive regions. These layers could help charge transport in the forward direction and/or help to block charge transport in the reverse direction. The same charge transport layer(s) could be used between the respective electrodes and all the emissive regions or specific charge transport layers could be used for each emissive material. Especially where the same material is used for the charge transport layer for all the emissive regions it may be found that in many cases the device will perform acceptably if the charge transport layer is not patterned—thus a continuous transport layer may be used over the entire device. Where a charge transport layer is to be patterned it may be deposited uniformly and then patterned or may be deposited in a patterned form, e.g. by ink jet printing. Other layers could be present such as barrier layers to counteract degradation of the device during use, conducting layers to improve charge distribution over the area of the device, insulating layers to inhibit unwanted charge migration, or protection layers to prevent degradation of parts of the device during manufacture.

Instead of (or in addition to) the patterning of the anode into lines the cathode could be patterned into lines parallel to the rows of emissive material. Where the “top” electrode (i.e. the later of the electrodes to be deposited—the cathode in the example of FIGS. 3 and 4) is patterned it will be appreciated that the banks 70 can usefully serve to protect lower layers from damage from the process of patterning the top electrode, particularly by spacing active pixel edges laterally from the patterned edges of the top electrode regions.

The cathode could be located in front of the emissive regions, with the anode behind them. In that case, the cathode should be of a light transmissive material.

It may be desirable to sharpen spatially the emission from one or more of the emissive regions to improve the effect of the display. One efficient way to achieve this is by defining a resonant cavity within the device which can spatially and/or spectrally narrow the emission by means of interference and/or cavity effects. One particularly efficient way of implementing such a cavity is by integrating the emissive material itself into such a cavity, with (for instance) the spacing between the anode and cathode electrodes on either side of the emissive material defining the ends of the cavity. Additional layers such as dielectric stacks could be provided to define some or all of the cavity. The cavity itself could be augmented by the thickness of the organic layers.

The LCD unit is a conventional passive matrix LCD unit. Any suitable type of LCD unit could be used, including ferroelectric, TN and STN types. It will be appreciated that liquid crystal displays are just one class of light-switching devices that could be used in relation to the present invention and that other suitable devices could be used instead.

The present invention may include any feature or combination of features disclosed herein either implicitly or explicitly or any generalisation thereof, irrespective of whether it relates to the presently claimed invention. In view of the foregoing description it will be evident to a person skilled in the art that various modifications may be made within the scope of the invention.

The invention claimed is:

1. A method of operating a display device, the display device comprising:

a first electrode;

a small molecule organic light emissive layer deposited over the first electrode, the small molecule organic light emissive layer comprising light emissive material for emission of light, wherein the small molecule organic light emissive layer is a patterned layer which has been deposited by solution processing; and a second electrode deposited over the organic light emissive layer;

wherein the display device comprises a resonant structure comprising one of a cavity, a microcavity and an interference structure into which one or more regions of the light emissive material are integrated; and wherein the method comprises:

using the resonant structure to spatially narrow the emission of light from the one or more regions by at least one of interference and cavity effects.

2. The method of claim 1, wherein the organic light emissive layer has been deposited by a process of ink-jet deposition.

3. The method of claim 1, wherein the organic light emissive patterned layer comprises regions of red, green and blue light emissive materials.

4. The method of claim 1, wherein the display device includes:

a charge transport layer between the organic light emissive layer and the first electrode; and the organic light emissive layer is disposed over and in physical contact with the charge transport layer.

5. The method of claim 4, wherein the charge transport layer comprises one or more polymers.

6. The method of claim 5, wherein the one or more polymers comprise polystyrene sulphonic acid doped polyethylene dioxythiophene (PDOT:PSS) and/or poly(2,7-(9,9-di-n-octylfluorene)-(1,4- phenylene-4-imino(benzoic acid))-1,4-phenylene-(4-imino(benzoic acid))1,4-phenylene))(BFA) and/or polyaniline and/or PPV.

7. The method of claim 4, wherein the charge transport layer is patterned.

8. The method of claim 7, wherein the charge carrier transport layer has been deposited by a process of ink-jet deposition.

* * * * *